United States Patent [19]

Sasaki

[11] Patent Number: 4,761,677
[45] Date of Patent: Aug. 2, 1988

[54] SEMICONDUCTOR DEVICE HAVING NEW CONDUCTIVE INTERCONNECTION STRUCTURE AND METHOD FOR MANUFACTURING THE SAME

[75] Inventor: Nobuo Sasaki, Kawasaki, Japan

[73] Assignee: Fujitsu Limited, Kawasaki, Japan

[21] Appl. No.: 8,139

[22] Filed: Jan. 22, 1987

Related U.S. Application Data

[63] Continuation of Ser. No. 827,179, Feb. 6, 1986, abandoned, which is a continuation of Ser. No. 738,498, May 28, 1985, abandoned, which is a continuation of Ser. No. 418,010, Sep. 14, 1982, abandoned.

[30] Foreign Application Priority Data

Sep. 18, 1981 [JP] Japan ................................ 56-148092
Sep. 18, 1981 [JP] Japan ................................ 56-148094

[51] Int. Cl.$^4$ ........................................... H01L 29/28
[52] U.S. Cl. ............................................. 357/8; 357/67; 357/71
[58] Field of Search ................. 357/71, 8, 67, 59 J, 357/59 K

[56] References Cited

U.S. PATENT DOCUMENTS

| | | | |
|---|---|---|---|
| 3,634,927 | 1/1972 | Neale et al. | 357/2 |
| 3,766,445 | 10/1973 | Reuter et al. | 357/71 |
| 3,806,778 | 4/1974 | Shimakura et al. | 357/71 |
| 3,967,371 | 7/1976 | Croset et al. | 357/71 |
| 4,045,302 | 8/1977 | Gribbs et al. | 357/71 |
| 4,199,778 | 4/1980 | Masuhara et al. | 357/65 |
| 4,204,216 | 5/1980 | Heeger et al. | 357/8 |
| 4,222,903 | 9/1980 | Heeger et al. | 252/500 |
| 4,269,738 | 5/1981 | Pez et al. | 252/500 |

FOREIGN PATENT DOCUMENTS 0021818 1/1981 European Pat. Off.
0022271 1/1981 European Pat. Off.

OTHER PUBLICATIONS

Mukai et al., "Planar Multilevel Interconnection Technology Employing a Polymide", *IEEE Jour. of Soldi-State Circuits*, vol. SC-13, No. 4, Aug. 1978.
Electronics and Communications in Japan, "Three-Level Metallization with PIQ Insulation", Saiki et al., vol. 63-C, No. 6, 1980, pp. 89–97.
Applied Physics Letters, "The Mechanism of Schottky-Barrier Formation in Polyacetylene", Waldrop et al., vol. 38, No. 1, Jan. 1, 1981, pp. 53–55.

*Primary Examiner*—Andrew J. James
*Assistant Examiner*—Mark Prenty
*Attorney, Agent, or Firm*—Staas & Halsey

[57] ABSTRACT

A reliable multilevel interconnection structure is attained by using polyacetylene layers. Nondoped polyacetylene is dielectric but is conductive when it is doped with an impurity such as $AsF_5$, which makes it possible to eliminate the necessity of opening a contact hole or through hole in an insulating layer in a process for manufacturing a multilevel interconnection structure so that a disconnection and/or short circuit does not occur due to the evenness of the layers even if the layer of numbers is increased.

3 Claims, 4 Drawing Sheets

SEMICONDUCTOR DEVICE HAVING NEW CONDUCTIVE INTERCONNECTION STRUCTURE AND METHOD FOR MANUFACTURING THE SAME

This is a continuation of co-pending application Ser. No. 827,179 filed on Feb. 6, 1986, and now abandoned, which is a continuation of Ser. No. 738,498 filed May 28, 1985, which is a continuation of Ser. No. 418,010, filed Sept. 14, 1982 (both abandoned).

BACKGROUND OF THE INVENTION

This invention relates to semiconductor devices, more particularly, semiconductor devices having a new conductive interconnection structure, and a method for manufacturing the same.

The packing densities and the degree of integration of integrated circuits are increasing more and more and multilevel interconnections are formed in integrated circuits which tend to increase the number of levels of the device. The reliability of multilevel interconnections is an important problem in semiconductor device productions and a large number of techniques to improve the reliability have been proposed. In general, multilevel interconnections are formed by depositing alternate lines of patterned interconnections separated by dielectric layers. The lines of patterned interconnections are usually, of metal, especially aluminum. The multiple metal-interconnection lines are interconnected by way of through holes provided in the dielectric layers. The interconnections by way of the through holes between multiple metal-interconnection lines are formed by creating holes in the dielectric layer which exists over a first metal-interconnecting line, depositing a second metal layer over the dielectric layer and into the holes, thereby forming a metal interconnection between the first metal line and the second metal layer, and patterning the second metal layer to form a second metal-interconnecting line. In such a process, the steps at the holes of the dielectric layers make the metal lines uneven and the steps at the edges of the patterned metal-interconnections make the dielectric layers uneven. Thus, when laminated layers are increased in number, disconnections and/or short circuits in the interconnections are possible. Further, at the steps of the through holes of a phospho-silicate glass (PSG) layer deposited over a first metal-interconnecting line which is formed over a silcon dioxide layer, the glass flow method for providing a gentle slope to the peripheries of the through holes cannot be used due to the reaction of aluminum with silicon dioxide at temperatures above 500° C. It is, therefore, not recommended to laminate more than 3 to 5 layers of interconnections.

SUMMARY OF THE INVENTION

It is therefore an object of the present invention to provide an improved multilevel interconnection structure which is reliable due to absence of sharp steps in the multiple layers.

The above and other objects are attained by providing a semiconductor device, comprising:
a semiconductor substrate;
a diffused region formed in the semiconductor substrate;
a polyacetylene layer formed on the semiconductor substrate, the polyacetylene layer having an impurity doped region; and
a wiring pattern electrically connected to the diffused region, at least a portion of the wiring pattern being formed by the impurity doped region.

Polyacetylene $(CH)_x$ can be grown in the form of a film over a substrate with the aid of a Zeigler-Natta catalyst and the film thickness can be adjusted to be about 0.1 to 0.5 $\mu$m. It is known that polyacetylene acts as a P type semiconductor when doped with chlorine $Cl_2$, bromine $Br_2$, ioding $I_2$, fluorides such as arsenic pentafluoride $AsF_5$, iodides such as iodine chloride $ICl$, boron compounds, sulfuric acid $H_2SO_4$, nitric acid $HNO_3$, etc., and acts as an N type semiconductor when doped with lithium Li, sodium Na, potassium K, etc. In addition, nondoped polyacetylene is an insulator having a conductivity of $10^{-6}$ $\Omega^{-1}cm^{-1}$, while doped polyacetylene can be a conductor having a conductivity of, for example, $10^3$ $\Omega^{-1}cm^{-1}$ corresponding to a resistivity of less than $10^{-3}$ $\Omega cm$. Polyacetylene polymer takes a cis-form when grown at a low temperature, e.g., $-70°$ C., and takes a trans-form when heated at a high temperature, e.g., 200° C., both of which can be conductors by being doped. The present invention is accomplished by applying the above-described characteristics of polyacetylene to a multilevel interconnection technique.

According to the present invention it is not necessary to make an insulating or conducting layer having steps. Without an insulating or conducting layer having steps, the occurrence of the above-mentioned disconnection and short circuit in a multilevel interconnection is prevented. Further, the present invention makes it possible to reduce the size (e.g., to 0.5 $\mu m\phi$) of an interconnecting portion, which interconnects two conductive lines separated by an insulating layer in which the interconnecting part is formed, since this portion can be formed by simply being doped. Therefore the deposition of interconnecting material into a hole, which requires a relatively large hole (e.g., 2 $\mu m\phi$) to ensure the interconnection through the hole, is not necessary.

In another aspect of the present invention, a method for manufacturing a semiconductor device is also provided, including the steps of: preparing a semiconductor substrate; forming a polyacetylene layer on the semiconductor substrate; covering the polyacetylene layer with a mask having a desired pattern; selectively introducing impurity atoms into a region of the polyacetylene layer, the region not covered with the mask; and forming a conductive layer on said polyacetylene layer.

These and other objects, features, and advantages will be more apparent from the following more detailed description of the present invention.

DESCRIPTION OF THE PREFERRED EMBODIMENTS

Figure 1:
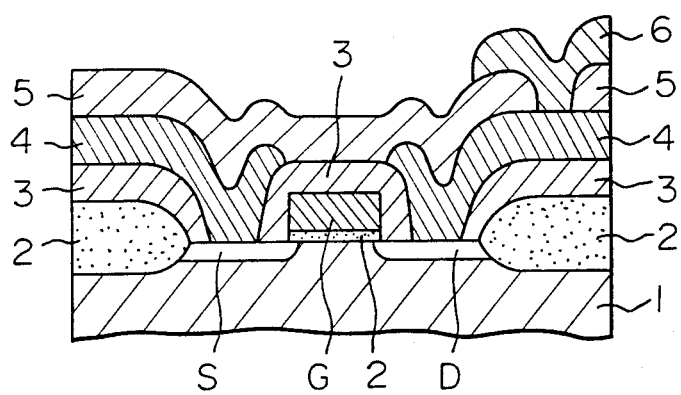
FIG. 1 is a prior art sectional view of a semiconductor device having a two-level-interconnection structure.

FIG. 1 is a two-level-interconnection prior art structure. The structure is formed over a metal-oxide (MOS) type semiconductor component comprising a source S, a drain D and a gate G formed in or on a semiconductor substrate 1 which is provided with an insulating silicon dioxide layer 2. The structure is made by forming a PSG film 3 as a protective film, opening windows therein, forming a first interconnecting line 4 for leading the interconnection from the source S and the drain D, depositing another PSG film 5, and forming a second interconnecting line 6. A connecting portion between the first and second interconnecting lines 4 and 6 is made by depositing the second interconnecting line into windows opened in the intermediate PSG film 5, which causes the deposited second interconnecting line to have sharp steps. It is mentioned above that such steps make it difficult to increase the number of interconnecton level.

Figure 2:
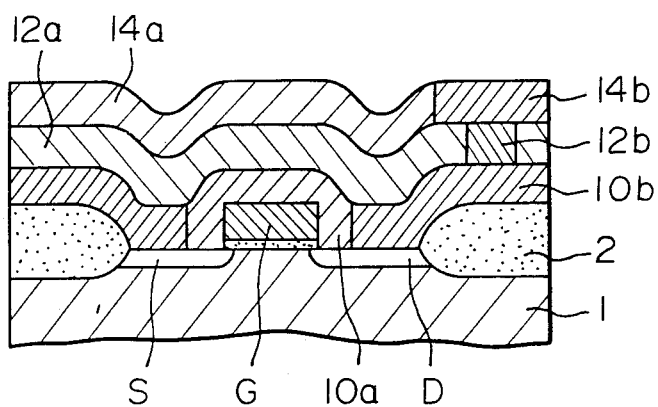
FIG.2 is a sectional view of a semiconductor device having a two-level-interconnection structure according to the present invention.

FIG. 2 shows a two-level-interconnection structure according to an embodiment of the present invention. This structure is also provided over a MOS type semiconductor component similar to that shown in FIG. 1. In this structure the two interconnecting layers 10 (10a and 10b) and 14 (14a and 14b) and one intermediate insulating layer 12 (12a and 12b) are made from polyacetylene, in which the conductive portions 10b, 12b, and 14b are doped and insulating portions 10a, 12a, and 14a are not.

A process for manufacturing this two-level-interconnection structure is described below as an example, with reference to FIGS 3a through 3f. After forming the MOS type semiconductor components in or on a semiconductor substrate, the substrate is coated on its upper surface with a Zeigler-Natta catalyst and is placed in an acetylene gas at a low temperature, e.g., about $-80°$ C., growing a cis-type polyacetylene layer 10 having a thickness of a few thousand Å. The Zeigler-Natta catalyst is removed by being dissolved with an organic solvent after the polyacetylene layer is grown. Since the grown polyacetylene layer has a structure in which polyacetylene fibers are intertwined, the Zeigler-Natta catalyst adhering therebetween can easily be removed without an organic solvent dissolving the polyacetylene layer.

Figure 4:
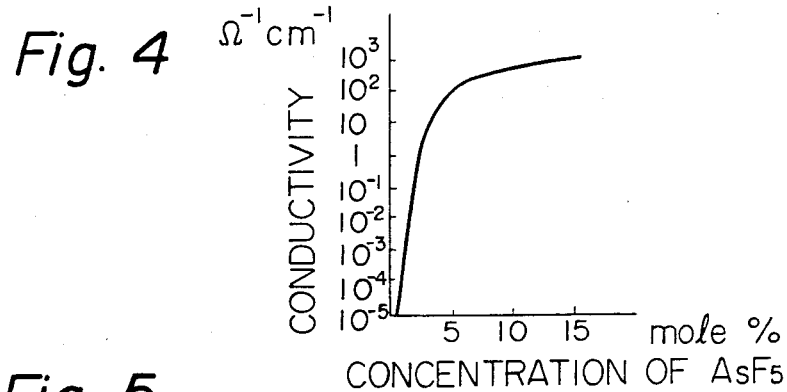
FIG. 4 is a graph of the conductivity of polyacetylene versus the concentration of doping.

Next, the polyacetylene layer 10 is covered with a resist 11 having a thickness of 1 $\mu$m, which is patterned to expose the portions of the electrodes, followed by implanting, e.g., $AsF_5$ ions with an implanting voltage of 200 keV into the exposed or unmasked portions of the polyacetylene layer to have an implanted concentration greater than 10 mole%, making the implanted portions 10b conductive. The conductivity of the polyacetylene which is implanted with $AsF_5$ is shown in FIG. 4, in which a conductivity of about $10^3 \Omega^{-1}cm^{-1}$ is attained by doping at a concentration of about 10 mole%. The conductivity of about $10^3 \Omega^{-1}cm^{-1}$ is as high as that of polycrystalline silicon having a high doping concentration. Further, in the example described above, the doping is performed by ion implantation, but other procedures such as diffusion or electrochemical doping methods may also be used.

Figure 3A:
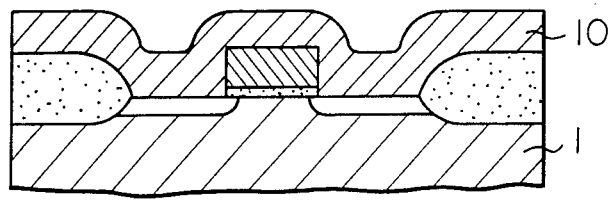
FIGS. 3a through 3f illustrate the process for manufacturing the semiconductor device shown in FIG. 2.
Figure 3B:
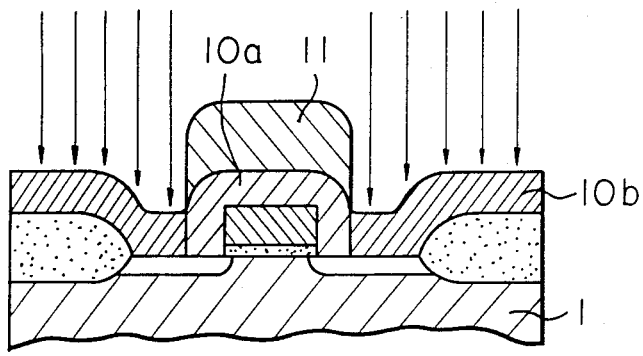
Figure 3C:
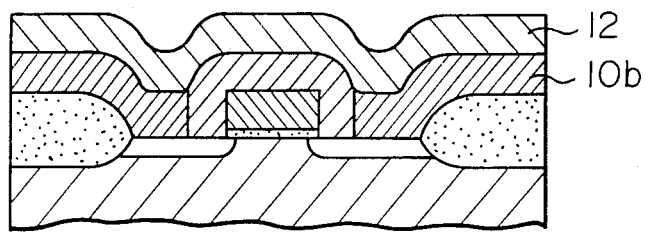
Figure 3D:
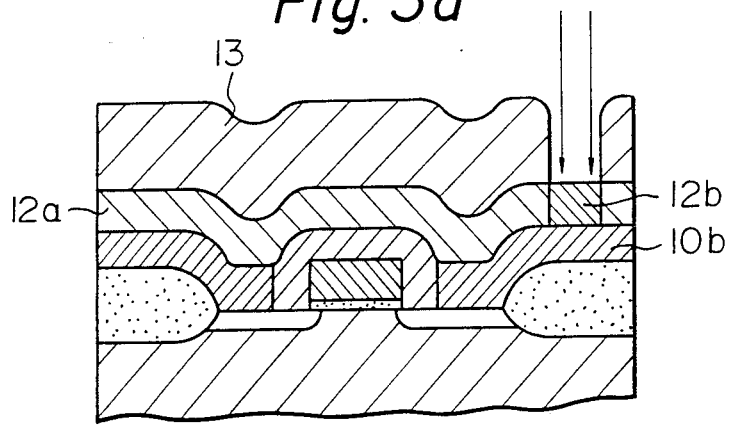
Figure 3E:
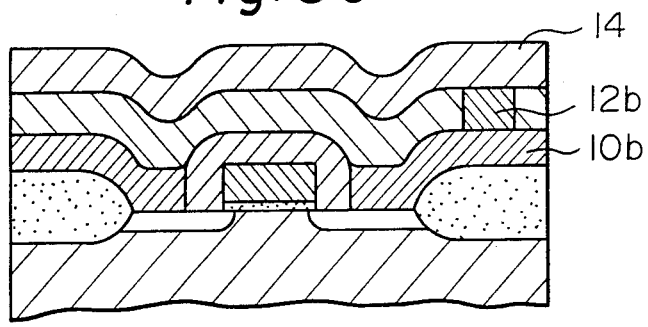
Figure 3F:
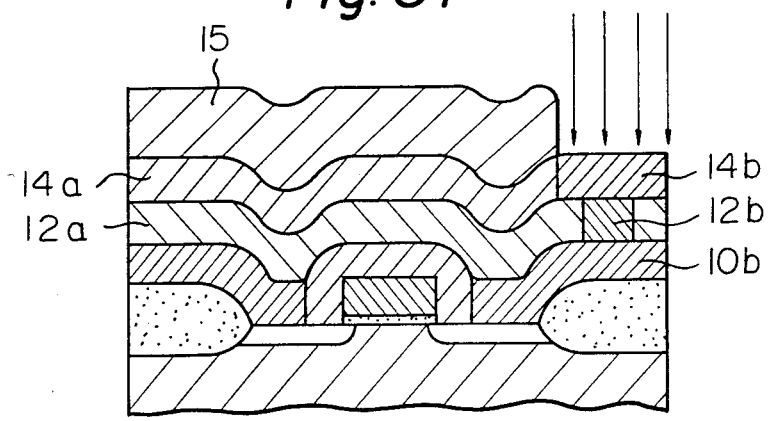

After removing the resist 11, a second polyacetylene layer 12 is formed over the first polyacetylene layer 10a and 10b, and a selective ion implantation is carried out over a patterned resist 13 to make a connecting part 12b for connecting the first and second interconnecting lines 10b and 14b (FIGS. 3c and 3d). The resist 13 is then removed. Next, a third polyacetylene layer 14 is formed over the second polyacetylene layers 12a and 12b and selective ion implantation is carried out over a patterned resist 15 to make a second interconnecting line 14b. The processes for making the second and third layers having insulating and conductive regions are similar to that for the first layer.

As can be seen from the above description, according to the embodiment of the present invention, windows are not opened for through holes and neither of the interconnecting lines have steps which in the prior art are formed at the edges of the patterned interconnecting line by being selectively etched. These features are advantageous to increase the number of interconnection levels without causing disconnections and/or short circuits.

Figure 5:
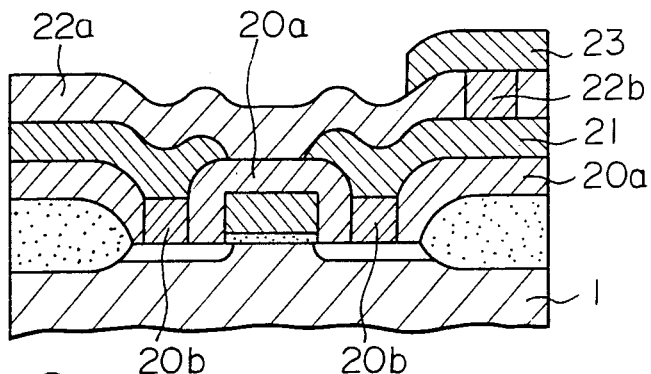
FIG. 5 is a sectional view of a semiconductor device having a two-level-interconnection structure using metal-interconnecting lines according to a second embodiment of the present invention.

FIG. 5 shows a two-level-interconnecton structure according to a second embodiment of the present invention. This interconnecting structure uses polyacetylene layers 20 (20a and 20b) and 22 (22a and 22b) for insulating layers having portions 20b and 22b connected between the interconnecting lines in the bottom interconnecting layer and the interconnecting lines in the upper interconnecting layer, but uses, e.g., aluminum lines for the interconnecting metal lines 21 and 23. In this structure, windows are not opened to make connections to electrodes or between metal-interconnecting lines, which is advantageous as mentioned in the preceding embodiment. Further, metal-interconnecting lines have an extremely high conductivity compared with polycrystalline silicon lines, and conductive portions 20b and 22b in the polyacetylene layers do not decrease conductivity due to their short lengths (under 1 $\mu$m). These features, therefore, make it possible for semiconductor devices to have a multilevel interconnections which are reliable and have an excellent conductivity. The process for making this interconnection structure is similar to that of the above-described embodiment, but metal lines are made, for example, by use of deposition and lithography techniques as in the prior art.

Figure 6:
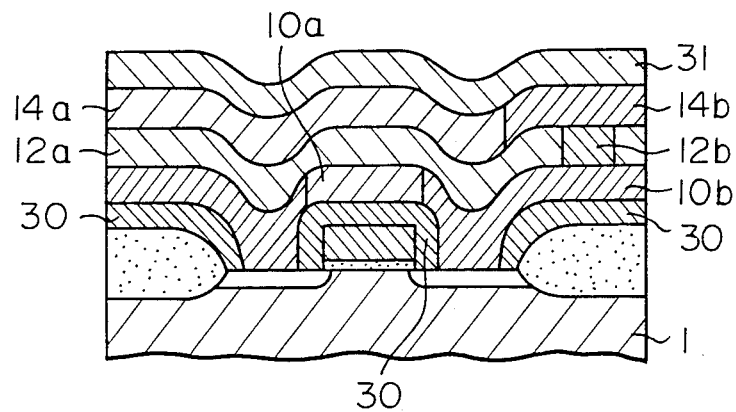
FIG. 6 is a sectional view of a semiconductor device having a two-level-interconnection structure covered with polyimide layers according to a third embodiment of the present invention.

FIG. 6 is a third embodiment of the present invention, in which a two-level-interconnection structure 10a, 10b, 12a, 12b, 14a, and 14b, similar to that shown in FIG. 2, is covered with protective polyimide layers 30 and 31 on the upper and lower surfaces of the structure. Polyacetylene layers are organic and sensitive to reaction with oxygen, having a tendency to decrease in conductivity when they are contacted with the air for a long time. Further, polyacetylene layers may deteriorate due to oxygen contained in a silicon oxide, PSG, or an other layer which often lies between an interconnection layer and a semiconductor component or substrate. This embodiment of the invention intends to prevent such deterioration by covering the polyacetylene layers with polyimide layers. Polyimide layers are preferable since they are water resistant and can be patterned by lithographic processes. The polyacetylene interconnecting layers are preferably covered with polyimide layers not only on the upper surface of the interconnecting layers but also on the lower surface.

The lower polyimide layer 30 may be formed, after forming semiconductor components in or on a semiconductor substrate 1, by applying polyimide over the semiconductor components or substrate by means of a spin coater, heat treating polyimide at a temperature of 200° C. to 300° C. for an hour to set the polyimide, the layer having a thickness of 4000 to 5000 Å, coating thereon a resist, patterning the resist, etching the unmasked areas of the polyimide layer with hydrazine to open windows for leading electrodes, and removing the resist. The upper polyimide layer 31 may easily be formed by carrying out the application and the heat treatment described above.

It should be noted that the above descriptions are only as examples and modifications, especially, combinations of the described embodiments may easily be made by a person skilled in the art.

I claim:

1. A semiconductor device comprising:
   a substrate;
   wiring layers formed on said substrate;
   a conductive region formed in said substrate;
   a first polyacetylene layer formed on said conductive region, said first polyacetylene layer exhibiting insulating properties and having a first doped region, said first doped region being conductive and being electrically connected to said conductive region; and
   a second polyacetylene layer formed directly on said first polyacetylene layer and including a second doped region electrically connected to said conductive region below said first polyacetylene layer through said first doped region.

2. A semiconductor device according to claim 1, wherein said conductive region is a diffused region formed in a portion of said substrate.

3. A semiconductor device according to claim 1, further comprising a third polyacetylene layer formed under said first polyacetylene layer having a third doped region, wherein said conductive region is the third doped region of said third polyacetylene layer.

* * * * *

UNITED STATES PATENT AND TRADEMARK OFFICE
CERTIFICATE OF CORRECTION

PATENT NO. : 4,761,677
DATED : AUGUST 2, 1988
INVENTOR(S) : NOBUO SASAKI

It is certified that error appears in the above-identified patent and that said Letters Patent is hereby corrected as shown below:

```
FRONT PAGE, Col. 2, line 8, "Soldi-S-" should be --Solid- --;
                   line 9, "tate" should be --State--;
      ABSTRACT [56] line 9, "layer of num-" should be
                            --number of layers--;
                   line 10, delete "bers".

Col. 1, line 29, "usually," should be --usually--;
       line 49, "silcon" should be --silicon--.

Col. 2, line 8, "P type" should be --P-type--;
       line 9, "ioding" should be --iodine--;
       line 12, "N type" should be --N-type--;
       line 20, "trans-form" should be --transform--;
       line 47, "said" should be --the--;
       line 53, delete "prior art"; and "a semiconduc-"
                should be --a prior art semiconduc- --.

Col. 3, line 23, "ton level." should be --tion levels.--.

Col. 4, line 39, delete "a";
       line 54, delete "an".
```

Signed and Sealed this

Sixth Day of December, 1988

Attest:

DONALD J. QUIGG

Attesting Officer

Commissioner of Patents and Trademarks